United States Patent
Allpress et al.

(10) Patent No.: US 6,378,106 B1
(45) Date of Patent: Apr. 23, 2002

(54) VITERBI DECODING USING SINGLE-WRONG-TURN CORRECTION

(75) Inventors: Stephan A. Allpress, Hoboken; Mark D. Hahm, Flanders, both of NJ (US)

(73) Assignee: Lucent Technologies Inc., Murray Hill, NJ (US)

(*) Notice: Subject to any disclaimer, the term of this patent is extended or adjusted under 35 U.S.C. 154(b) by 0 days.

(21) Appl. No.: 09/321,794

(22) Filed: May 28, 1999

(51) Int. Cl.[7] .............................................. H03M 13/00
(52) U.S. Cl. ..................................................... 714/795
(58) Field of Search ................................ 714/794–795; 375/341, 262

(56) References Cited

U.S. PATENT DOCUMENTS

| | | | | |
|---|---|---|---|---|
| 5,878,092 A | * | 3/1999 | Choi | 375/341 |
| 5,917,837 A | * | 6/1999 | Stein | 714/758 |
| 6,094,465 A | * | 7/2000 | Stein et al. | 375/346 |
| 6,199,191 B1 | * | 3/2001 | Iwata | 714/795 |

FOREIGN PATENT DOCUMENTS

| | | |
|---|---|---|
| EP | 0802636 A2 | 10/1997 |
| EP | 0891048 A2 | 1/1999 |

OTHER PUBLICATIONS

Golda et al., VLSI Appropriate Design of a Trace–Back Viterbi Decoder, IEEE, p. 76–80, 1994.*

"Variable Data Rate Viterbi Decoder With Modified Lova Algorithm", S. Czaja, et al, IEEE Region Ten International Conference on Microelectronics and VLSI. (TENCON), Nov. 6, 1995, pp. 472–475.

"Error–Correction Coding for Digital Communications", George C. Clark, et al, 1981, pp. 297–302.

"List Viterbi Decoding Algorithms with Application" IEEE Transactions on Communications, vol. 42, No. 2/3/4, Feb. 1994, pp. 313–323.

* cited by examiner

*Primary Examiner*—Albert Decady
*Assistant Examiner*—Shelly A Chase
(74) *Attorney, Agent, or Firm*—Birch Stewart Kolasch & Birch

(57) ABSTRACT

A recursive, single-wrong-turn (SWT) decoding method and Viterbi decoder which requires no additional circuitry or processing to keep track of a running list of the L best paths. If the most likely (ML) path fails frame quality metric tests, a search is made through a trellis using an existing survivor (trace back) information stored in a survivor (trace back) memory. An iteration in the recursive algorithm includes tracing back along the ML path to a particular stage, then deviating from the ML path and following the survivor information along that new deviant path, and finally checking the fully decoded frame to see if the frame quality metrics are acceptable for the frame. These same trace back steps can be performed for every stage in the trellis, deviating from a different stage on the ML path each time. A recursive, single-wrong-turn (SWT) decoding method and Viterbi decoder which exceed the performance of the general Viterbi algorithm and the various conventional list Viterbi decoders and which is much less computationally and physical complex.

24 Claims, 15 Drawing Sheets

VITERBI DECODING USING SINGLE-WRONG-TURN CORRECTION

BACKGROUND OF THE INVENTION

1. Field of the Invention

The present invention relates to digital cellular communication systems and more particularly to error correcting decoders employed in digital cellular communications.

2. Description of the Related Art

The Viterbi algorithm is used in numerous communications systems receivers to decode symbols generated in a corresponding transmitter through the forward error correction technique of convolutional encoding. The Viterbi algorithm has been shown to provide, at the receiver, the maximum likelihood estimate of the sequence of bits originally entering the convolutional encoder of the transmitter. In essence, if the receiver is able (or willing) to make only one guess at the transmitted sequence of bits, then the guess that the Viterbi algorithm produces will be correct more often, in a statistical sense, than any other guessing method.

Many of the communications systems which employ convolutional coding as a forward error correction technique transmit data in finite length packets consisting, typically, of several tens to several thousands of bits. These packets of bits may be appended with a small block code, such as a cyclic redundancy code (CRC), as an error detection device. The packet of bits, together with the appended block code, are passed through the transmitter convolutional encoder before being transmitted.

The purpose of the error detection code is to indicate if there is reason to believe the packet of data has been corrupted by the transmission channel to such a degree that the forward error correction techniques are unable to recover. Often, the error detection code is only powerful enough to derive whether or not an error has been detected in the received and decoded packet, and is usually incapable of specifying where in the packet the error(s) occurred or how many of the decoded bits might be in error. If, after decoding via the Viterbi algorithm, the appended error detection block code indicates that no errors were found in the transmitted packet, the packet is accepted as good. If, after decoding via the Viterbi algorithm, the appended error detection block code indicates that errors were found in the transmitted packet, the entire packet will, typically, be rejected as corrupt, resulting in a packet (or frame) erasure.

The presence of packet erasures at the receiver is an indication that the maximum likelihood sequence of transmitted bits (i.e., the sequence of bits outputted by the Viterbi algorithm) is not the correct sequence of transmitted bits. In other words, the Viterbi algorithm, which produces, at the receiver, the "best guess" of the bits sent by the transmitter, has guessed incorrectly.

If it is known, through evidence provided by the error detection code, that a packet has been unsuccessfully decoded through the normal Viterbi algorithm, then receiver performance may be improved by decoding according to some method other than the normal Viterbi algorithm, for example, a decoding method that does not produce the maximum likelihood estimate of the sequence of bits originally entering the convolutional encoder of the transmitter. A number of such algorithms have been proposed, including the various list Viterbi decoders.

A list Viterbi decoder, as described for example in "List Viterbi Decoding Algorithms with Application," Seshadri et al., IEEE Transactions on Communications, Vol. 42, No. 2/3/4, February/March/April 1994, keeps track not only of the best (and most likely) sequence of transmitted bits, but also the second best sequence, the third best sequence, the fourth best sequence, etc., up to the L best sequence, where L is an integer greater than 1. After decoding, these sequences are evaluated with the same error detection code that is used to evaluate the maximum likelihood sequence, and, if a sequence is found for which no errors are detected, that sequence is outputted from the receiver instead of the maximum likelihood sequence. List Viterbi decoders provide receiver performance improvements at the cost of additional processing circuitry and decoding operations.

SUMMARY OF THE INVENTION

The present invention is directed to a recursive technique which exceeds the performance of the general Viterbi algorithm and the various conventional list Viterbi decoders, which is much less computationally and physically complex.

In particular, the present invention is directed to a recursive technique which requires no additional circuitry or processing to keep track of a running list of the L best paths. If the most likely (ML) path fails frame quality metric tests, a search is made through the trellis using the existing survivor (trace back) information stored in the survivor (trace back) memory. An iteration in the recursive algorithm includes tracing back along the ML path to a particular stage, then deviating from the ML path and following the survivor information along that new deviant path, and finally checking the fully decoded frame to see if the frame quality metrics are acceptable for the frame. These same trace back steps can be performed for every stage in the trellis, deviating from a different stage on the ML path each time.

The add-compare-select operations for the recursive Viterbi technique of the present invention are identical to the conventional Viterbi decoder. The traceback information is also stored in the same manner as is done for the conventional Viterbi decoder. The traceback operations, however, are completely different for the recursive Viterbi technique of the present invention. In fact, multiple trace backs may be made through the stored trellis of trace back information in order to improve the estimate of the original transmitted data sequence beyond what is possible with the conventional Viterbi decoder. In the recursive traceback technique of the present invention:

a normal traceback is performed, identical to the algorithm described above for the conventional Viterbi decoder. The error detection code (usually a CRC code) is used to determine if any bits in the decoded frame are erroneous. If the error detection code indicates that no errors were made in the decoded frame, no further trace back operations are performed, and the maximum likelihood decoded sequence is outputted as the estimate of the transmitted data sequence; and if an error or errors are detected using the error detection code, then additional trace back steps are applied in an attempt to recover from bit errors that would otherwise lead to a corrupted frame. For a binary code, up to an additional B–I complete trace back operations (tracing back from the last stage of the trellis to the first stage of the trellis B–I times) may be performed, where B is the number of bits in a frame, with an evaluation of the newly decoded frame using the error detection code being performed after each trace back recursion. The additional trace back operations are performed just like normal Viterbi decoder traceback operations, except, at a single chosen stage in the trellis, the traceback information for the state of the maximum likelihood path is deliberately ignored, and the traceback continues down one of the other paths that merged into that state. When the traceback operation makes its way back to the beginning of the trellis, the new estimate of the transmitted sequence is checked against the error detection code. If no errors are found, the new sequence is outputted from the decoder. If errors are still detected, the traceback recursion is repeated, except the deviation from the maximum likelihood path occurs at a stage in the trellis that has not yet been used as the deviation point.

If it is known that some bits somewhere in this decoded frame are in error, an error detection code, such as a CRC, will give this information, then the information stored in the traceback memory (or "survivor" memory) is traversed again down a path that is effectively one wrong turn off of the maximum likelihood path. The recursion is repeated until either a path is found for which the error detection code indicates that there are no errors or all of the single wrong turn paths have been examined.

The recursive Viterbi technique of the present invention may exhaustively search all possible single-wrong-turns off of the maximum likelihood path through the trellis.

When applied in a system in place of a normal Viterbi decoder, the present invention lowers required signal power ($E_b/N_0$) beyond that achievable with a Viterbi decoder; or, equivalently, for a given signal power, the invention produces fewer frame-and/or bit-errors than does a Viterbi decoder.

The recursive technique of the present invention may also be utilized in any wireless receiver which implements a Viterbi decoder or a suboptimum variant thereof. This includes, but is not limited to, base station and mobile receivers that service IS-95, GSM, IS-54, or IS-136 users.

DETAILED DESCRIPTION OF THE PREFERRED EMBODIMENTS

Figure 1:
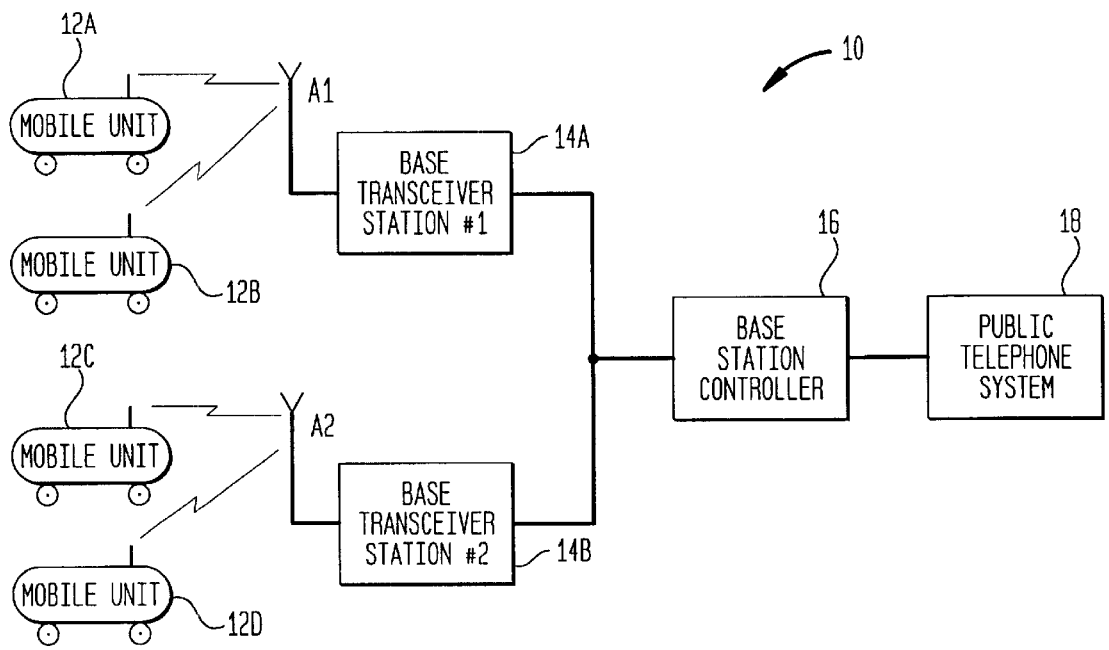
FIG. 1 illustrates a cellular system to which the recursive or single-wrong-turn (SWT) technique of the present application is applied.

A digital cellular communication system 10 is shown in FIG. 1 in which a preferred form of the present invention is embodied. The system 10 is operative in a defined geographic region such as all or part of a metropolitan area.

The cellular system 10 includes numerous mobile phone units, as represented by four illustrated units 12A through 12D. Communication links may be established between the mobile units 12A–12D and a base station for the communication cell within which the mobile unit(s) may be located. In this illustrative case two base stations 14A and 14B are shown. Antennae A1 and A2 are provided at the base stations to provide for receiving signals from transmitting mobile units.

A base station controller 16 provides system management functions through regulation of the operation of the base stations 14A and 14B and by establishing communication links with a public telephone system 18.

As set forth above, a list Viterbi algorithm requires circuitry and/or processing capability to keep a running record of the L best paths (L being the length of the list). A list Viterbi decoder decodes a receive sequence of symbols, checks the frame quality metric (typically a CRC), and then determines whether the information compiled in the list is required. If the frame quality metrics indicate that the ML path is in error, the information stored in the list is used to trace back through the L−1 next best paths in the hope that one of these will have acceptable frame quality metrics.

The recursive technique of the present invention requires no additional circuitry or processing to keep track of the running list of the L best paths. If the ML path fails frame quality metric tests, a search is made through trellis using the existing survivor (traceback) information stored in the survivor (traceback) memory and iteration in the recursive algorithm includes tracing back along the ML path to a particular stage, then deviating from the ML path and following the survivor information along that new deviant path, and finally checking the fully decoded frame to see if the frame quality metrics are acceptable for the frame. These same traceback steps can be performed for every stage in the trellis, deviating from a different stage on the ML path each time.

Figure 2:
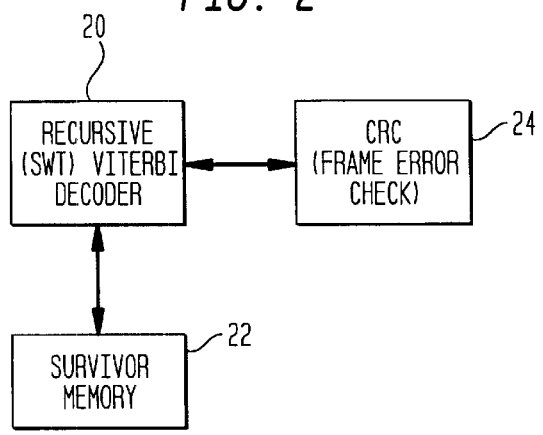
FIG. 2 illustrates a recursive (SWT) Viterbi decoder of the present invention in one embodiment.

FIG. 2 illustrates a recursive (SWT) (single-wrong-turn) Viterbi decoder 20 of the present invention in one embodiment. The phrase "recursive Viterbi" is used interchangeably with "SWT" which, stands for -single-wrong-turn; the kind of trellis-traversing errors that the recursive Viterbi technique of the present invention corrects. The recursive (SWT) Viterbi decoder 20 accesses a survivor memory 22 and a CRC (frame error check) 24, which will be discussed below.

The operation of the recursive (SWT) Viterbi decoder may be summarized by the following pseudo code:

1. Traverse entire trellis, storing all traceback information in a $2^{(k-1)} \times B$ array, where "k" is the code's constraint length and "B" is the number of bits in a frame.

2. Perform a "normal" traceback operation to decode the frame.

3. Check (via CRC or other frame quality metrics) if there were any bit errors in the frame.

If no bit errors, do nothing more; the frame was decoded correctly via the conventional method.

If bit errors were detected, then do recursive decoding to try to recover the entire frame of data by correcting a single wrong turn on the trellis.

Figure 3:
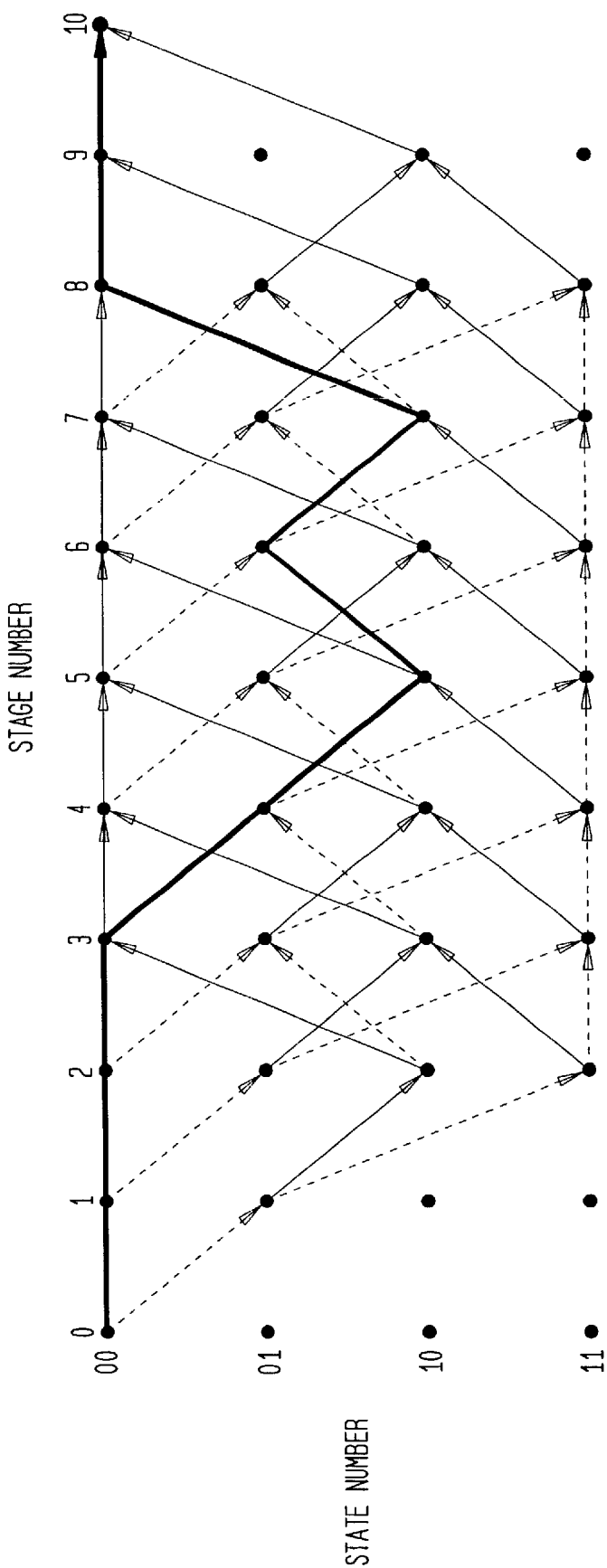
FIG. 3 illustrates an exemplary trellis and the path traversed by a conventional Viterbi decoder.

Recursive Decoding Algorithm:
    N=B;
    while Bit Errors>0 and N>0
        a) Do normal traceback again using the information stored in the $2^{(k-1)} \times B$ array, but when stage "N" in the traceback operation is reached, jump to the losing state (instead of the winning state indicated by the traceback bit) and continue tracing back in the normal way from that state.

b) Check to see if decoding in this way results in any bit errors.
  If no bit errors, then do nothing more; the frame has been decoded properly by correcting a single wrong turn on the trellis.
  If there are still bit errors, then let N=N−1 (and repeat recursive decoding algorithm).
end while;

An exemplary trellis is shown in FIGS. 3–15. The thick black line in FIGS. 3–15 indicates the path that was traversed by the maximum likelihood (ML) path. FIG. 3 illustrates the path traversed by a conventional Viterbi decoder. Assuming that this particular path through the trellis is not the correct one (the CRC check failed), the recursive technique of the present invention is applied to the information still stored in the survivor memory 22. Since the present invention keeps no running list of the best L paths, the stage at which deviation (the circled state in FIGS. 4–15) from the ML path is chosen is arbitrary. For simplicity, assume deviation begins from the last stage of the trellis (the rightmost stage) in FIGS. 3–15. Deviation could also begin at the first stage of the trellis (the leftmost) or any intermediate stage.

Figure 4:
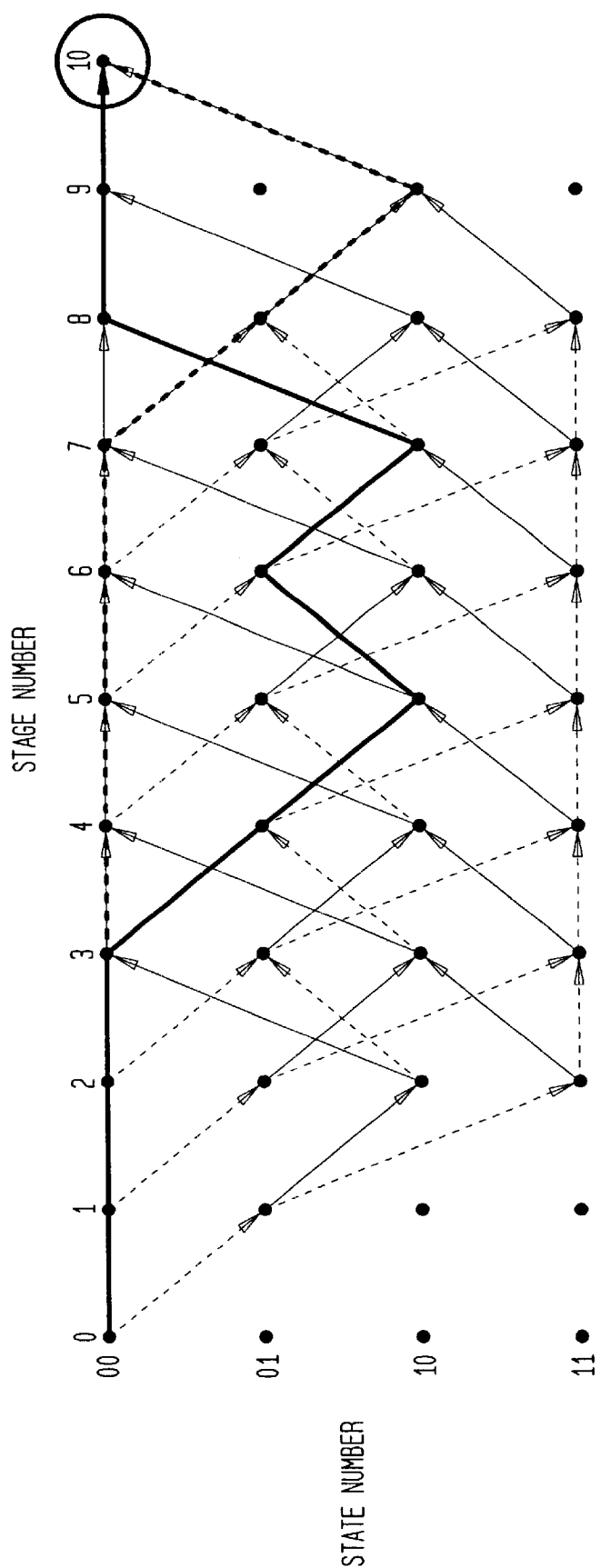
FIG. 4 illustrates the exemplary trellis and the first iteration performed by the recursive (SWT) technique of the present invention.
Figure 5:
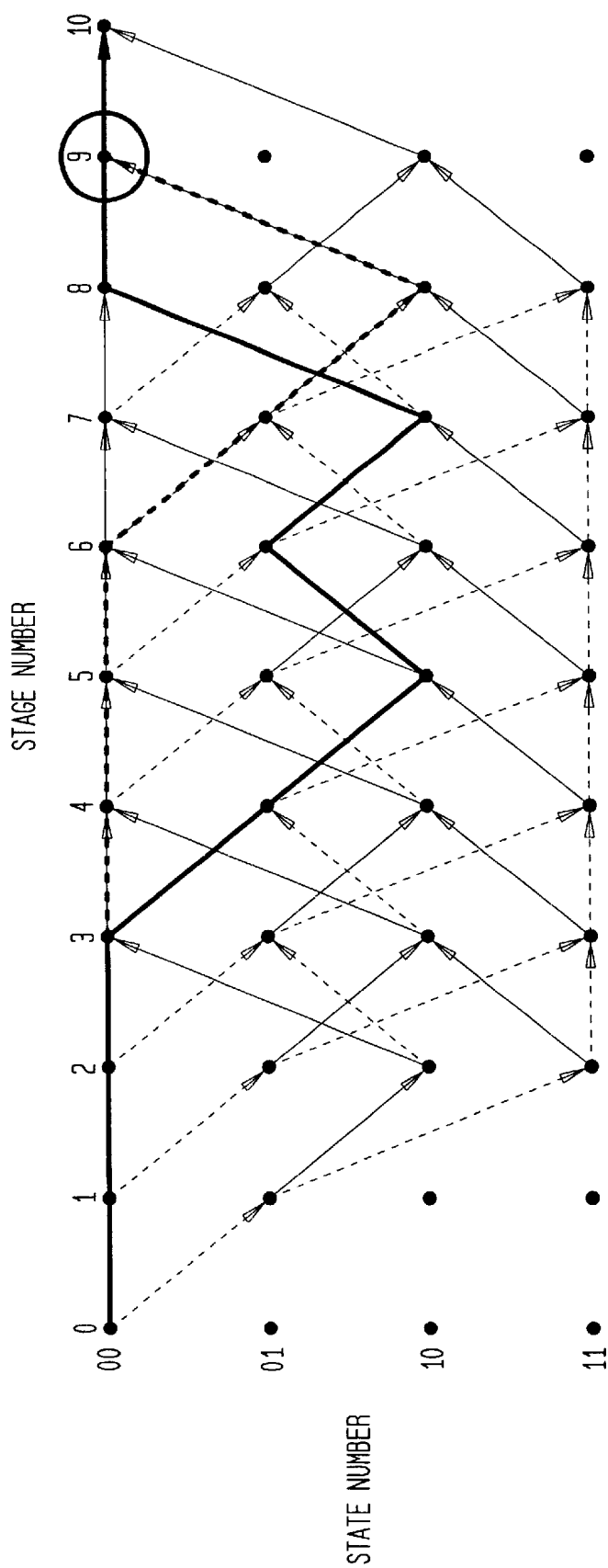
FIGS. 5 and 6 illustrate the second and third iterations of the recursive (SWT) technique of the present invention.
Figure 6:
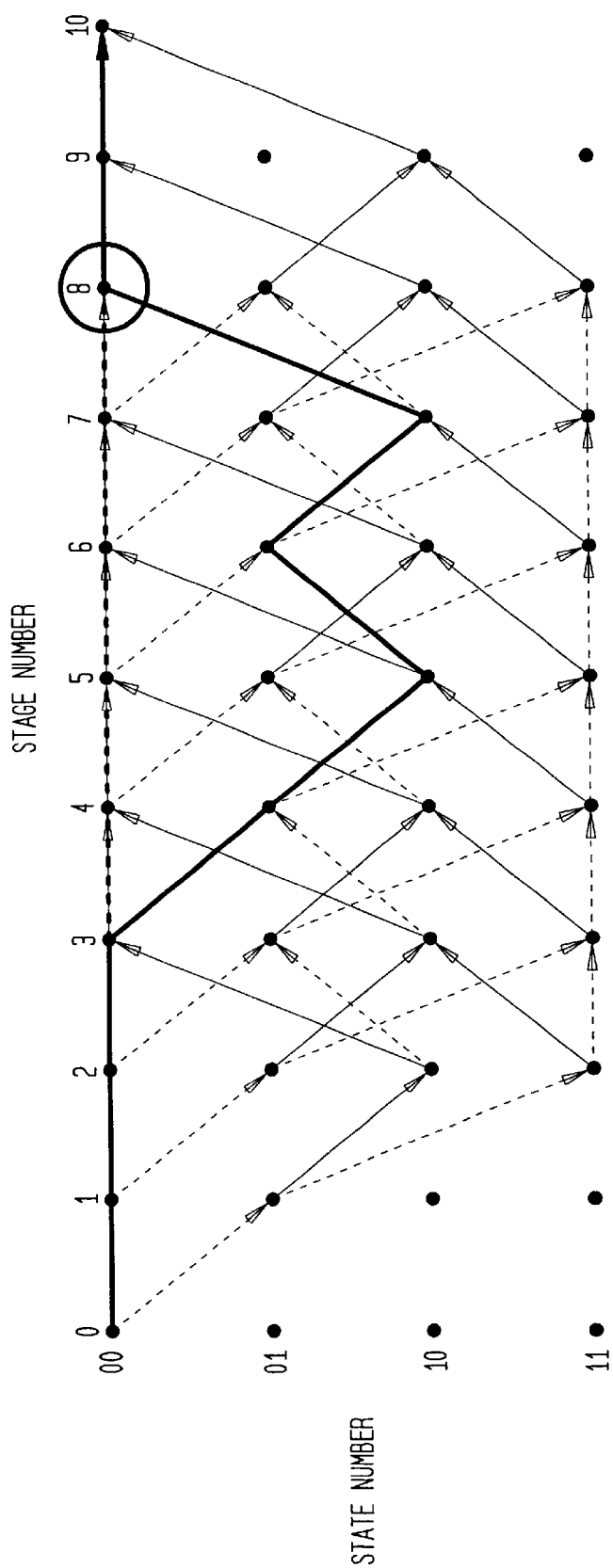
Figure 7:
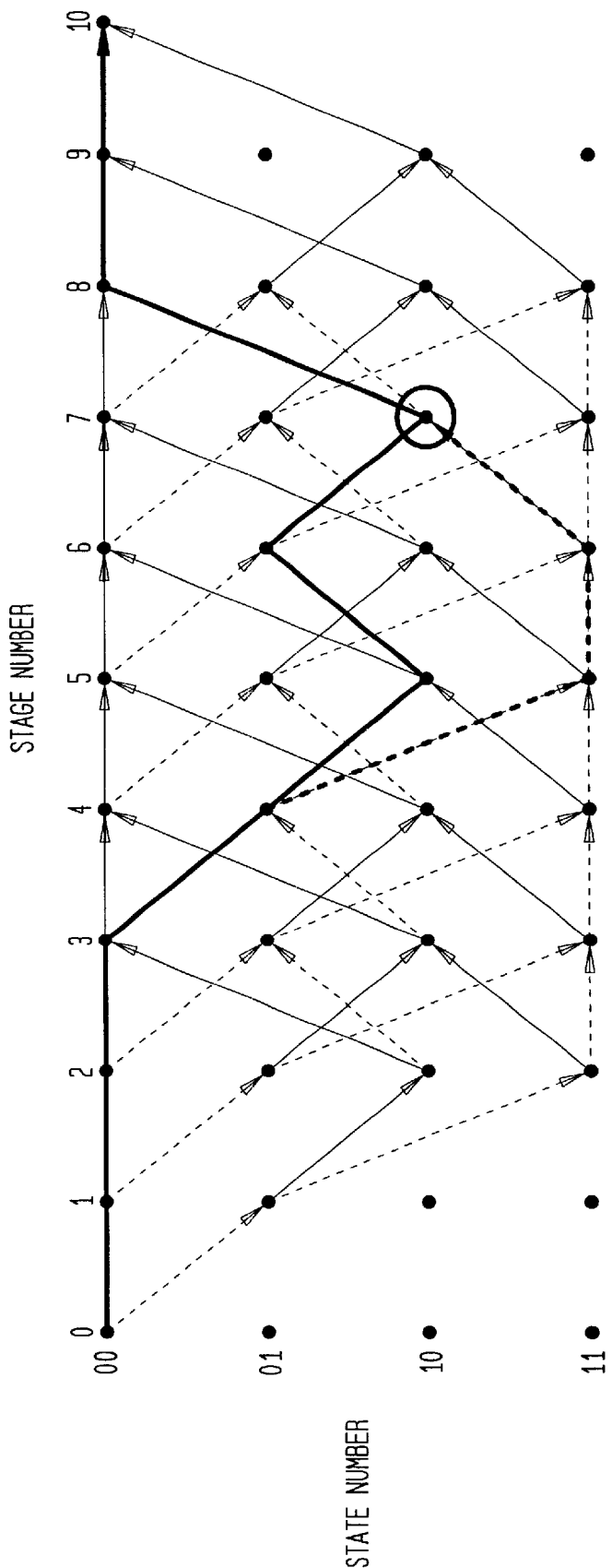
FIGS. 7–13 illustrate iterations 4–10 of the recursive (SWT) technique of the present invention.
Figure 8:
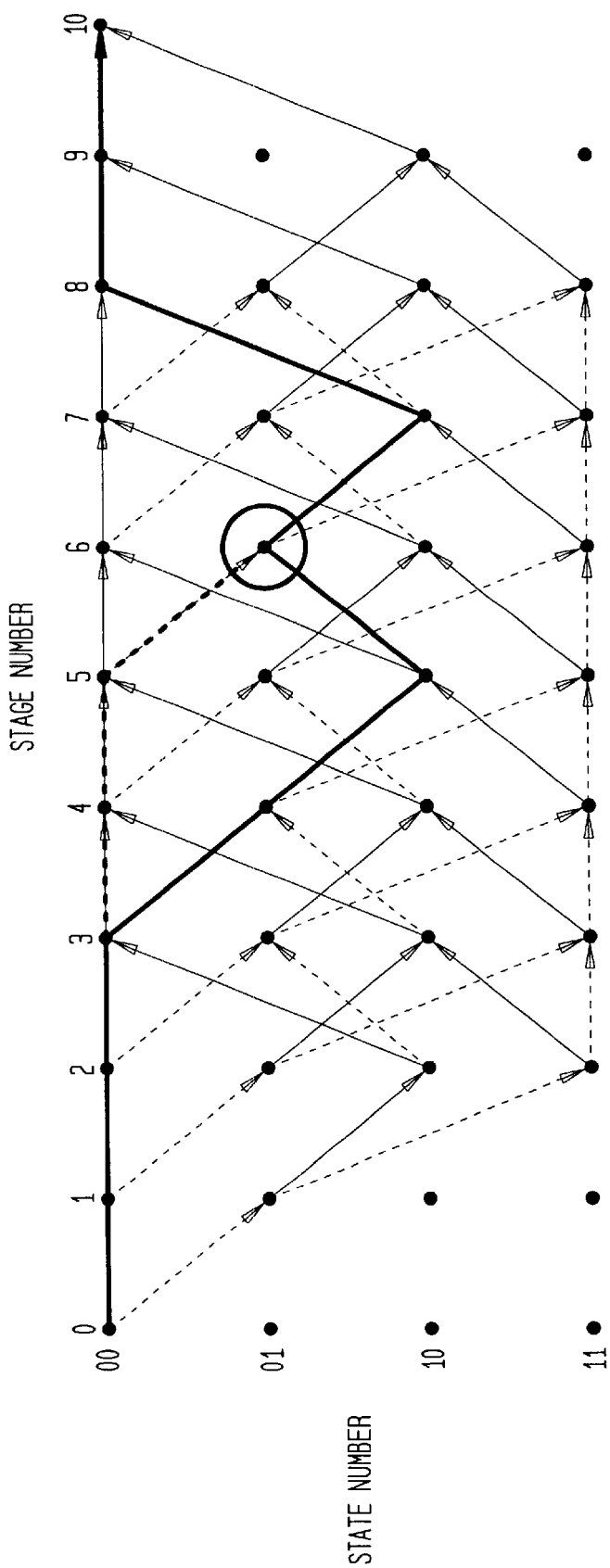
Figure 9:
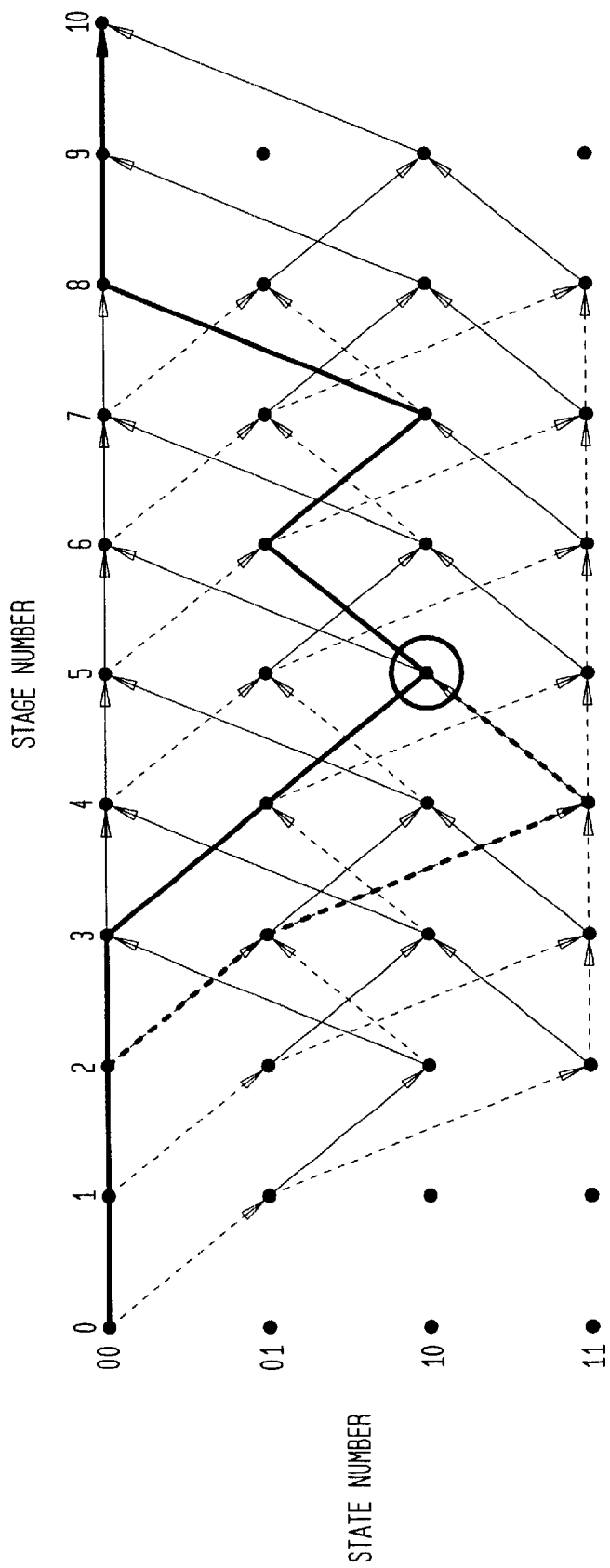
Figure 10:
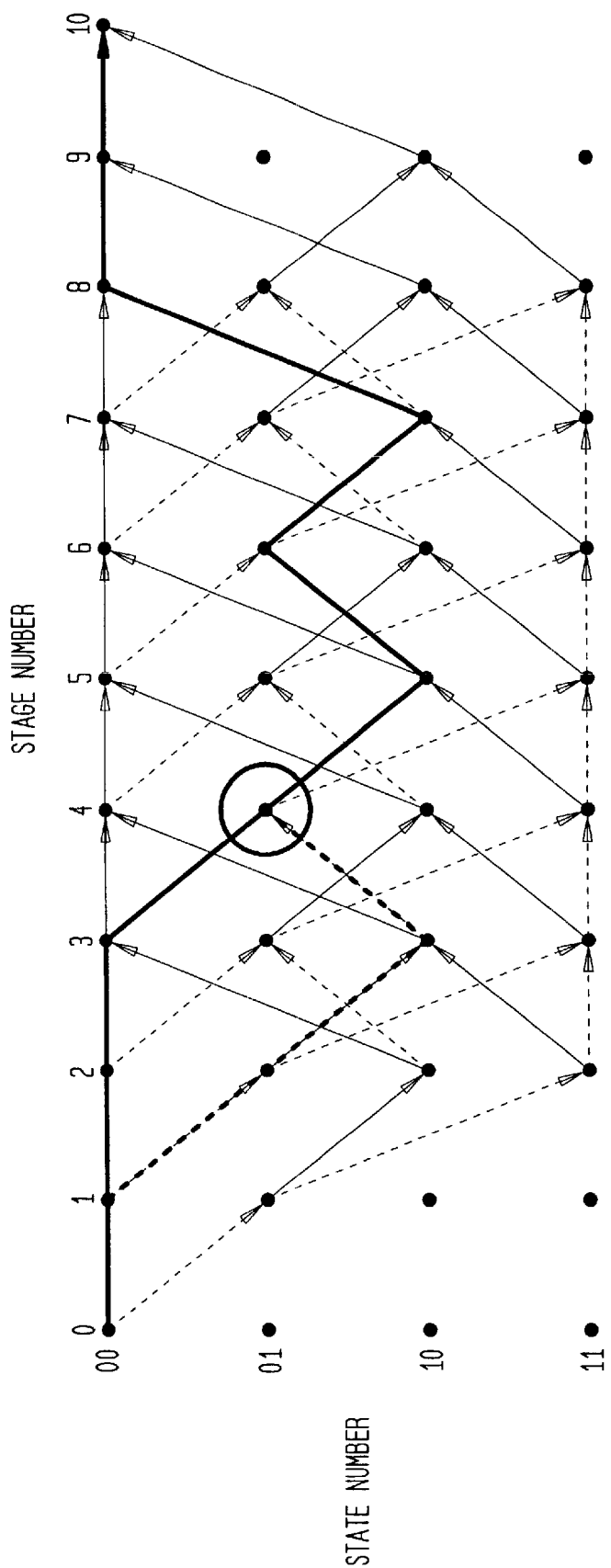
Figure 11:
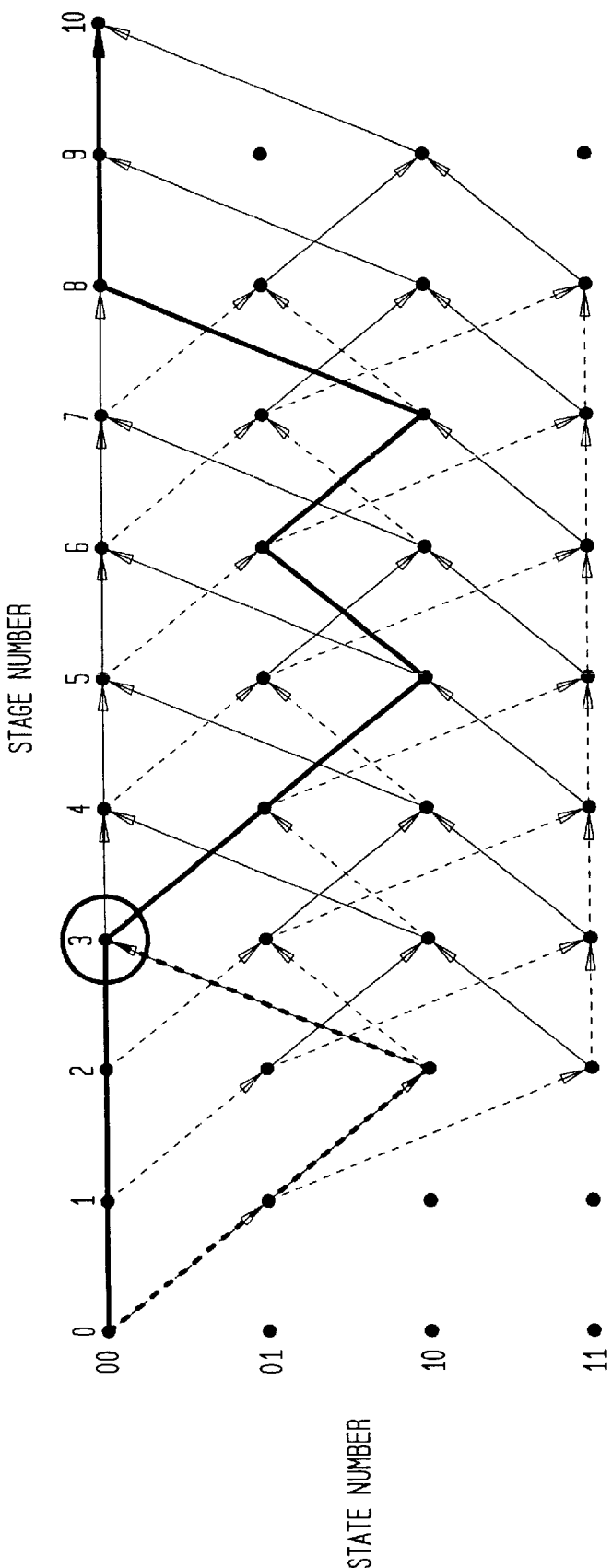
Figure 12:
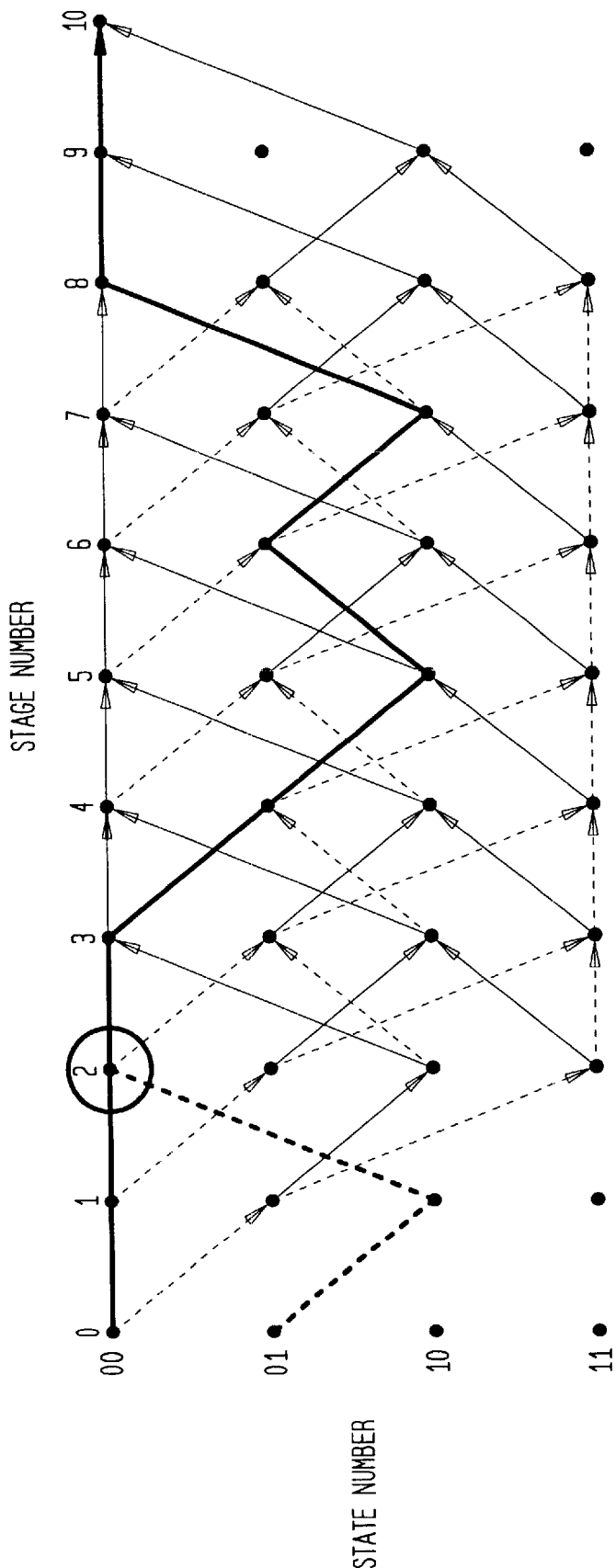
Figure 13:
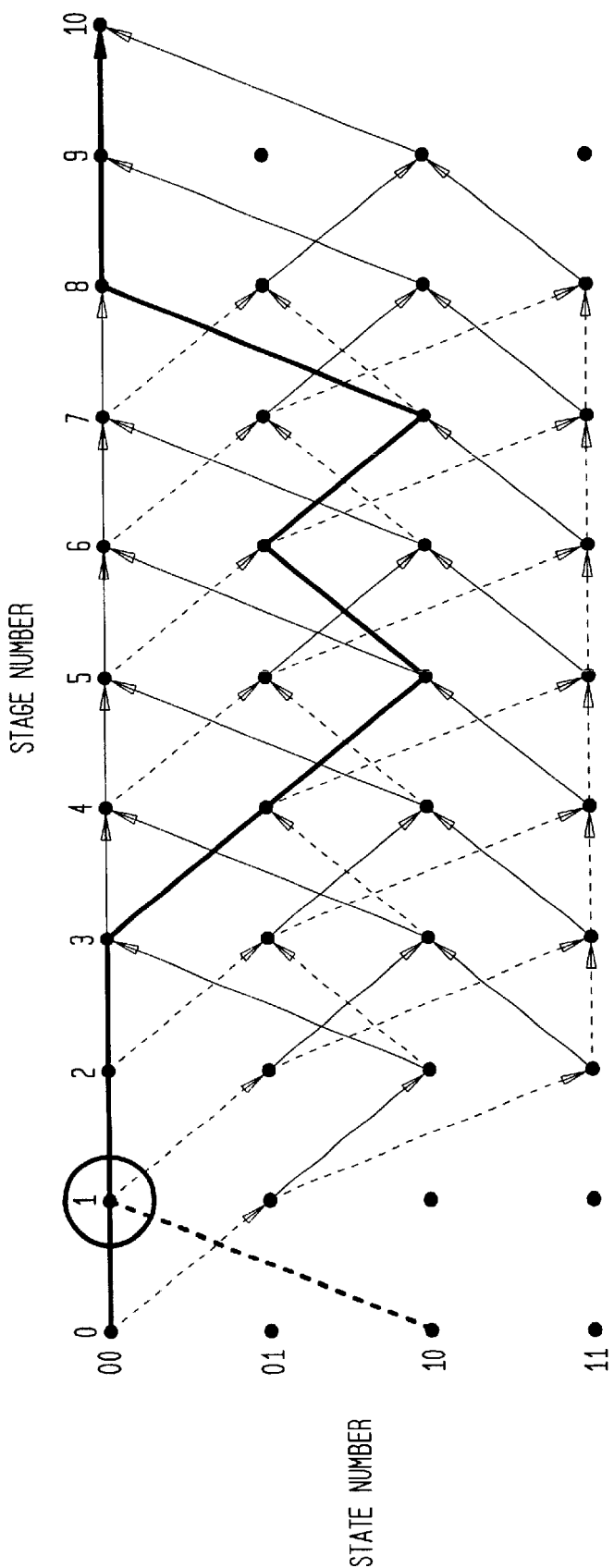

FIG. 4 shows that the first iteration in the present invention is to deviate from the ML path at the last stage of the trellis. The information stored in the survivor memory 22 indicates the rest of the path followed through the trellis (shown as a dark dashed line in FIG. 4). At stage 3, the path mapped out by the first iteration merges back into the ML path and follows the ML path back for the remainder of the trace back operation. Assuming that the decoded data sequence derived from this new path through the trellis does not pass the frame quality metric tests, a second iteration of the present invention is then applied. This is shown in FIG. 5. This time, the deviant path diverges from the ML path at stage 9. The dark dashed line indicates the path that this new trace back operation maps out. Assuming that the decoded data sequence derived from this new path through the trellis also does not pass the frame quality metric tests, a third iteration of the invention is then applied. This is shown in FIG. 6. This time, the deviant path diverges from the ML path at stage 8. The dark dashed line indicates the path that this new trace back operation maps out. Assuming that the decoded data sequence derived from this new path through the trellis does pass the frame quality metric tests, the recursive technique of the present invention stops and outputs a data sequence that passes the frame quality tests.

The recursive technique of the present invention then either stores the newly decoded sequence or the stage number at which the newly decoded sequence diverged from the ML path and then continues with the recursive algorithm to see if any other sequences can be decoded that also pass the frame quality metrics. If this option is chosen, and if multiple passing frames are found (a very rare occurrence), the frame quality metrics of all the frames that pass the frame quality metric tests should be compared, with the decoded frame that has the best metrics being outputted as the best guess at the decoded sequence. Normally, in a system where the frame quality metrics are considered reliable, to conserve time and hardware resources, the recursive technique of the present invention is operated in a mode that stops after the first decoded sequence is found that passes the frame quality metrics. In such a system, the recursive techniques stops after traversing the trellis as shown by the dark dashed line of FIG. 6 and output the data sequence derived from the third iteration of the recursive Viterbi algorithm.

FIGS. 7 through 13 show how the recursive technique of the present invention would progress if no frames were found that passed the frame quality metrics, or how the algorithm would progress if one wanted to exhaustively search the trellis and then compare the frame quality metrics of multiple frames after all iterations were complete. Note that in a system which is known to start in a particular state (often, the all zeros state), iteration 10 (illustrated in FIG. 13) and iteration 11 (not illustrated) are unnecessary, since any path that deviates from the ML path from either stage 2 or 1 cannot return to the known starting state by the beginning of the trellis (stage 0).

Figure 14:
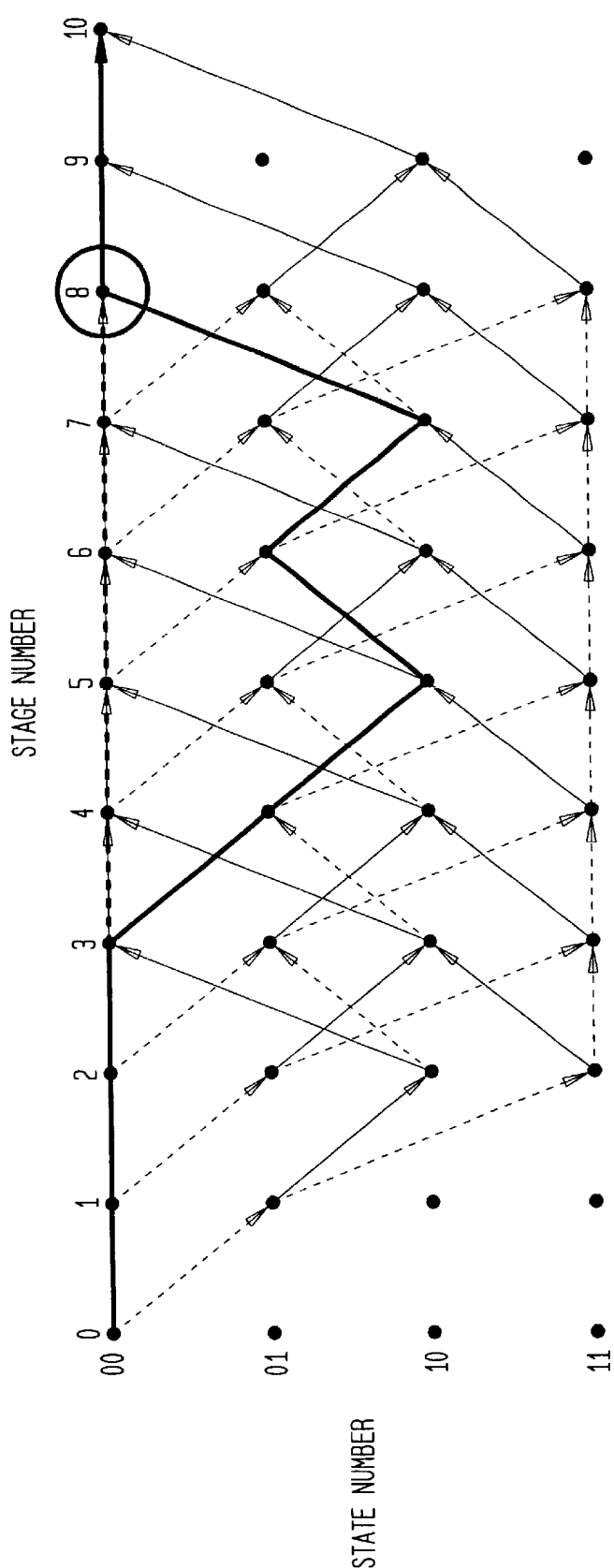
FIG. 14 illustrates the exemplary trellis of FIG. 3 as processed by a list Viterbi algorithm (LVA) where L=2.

An example of a list Viterbi algorithm (LVA) with L=2 applied to the same trellis and data is shown in FIG. 14. In this example, the information stored in the list indicates that the second best path (the dark dashed line) merged with the ML path (the thick black line) at state 00 of stage 8. A separate trace back operation is performed to examine the path that deviates from the ML path at that point, and the frame quality metrics of the resulting decoded data sequence are compared to the original ML path.

Figure 15:
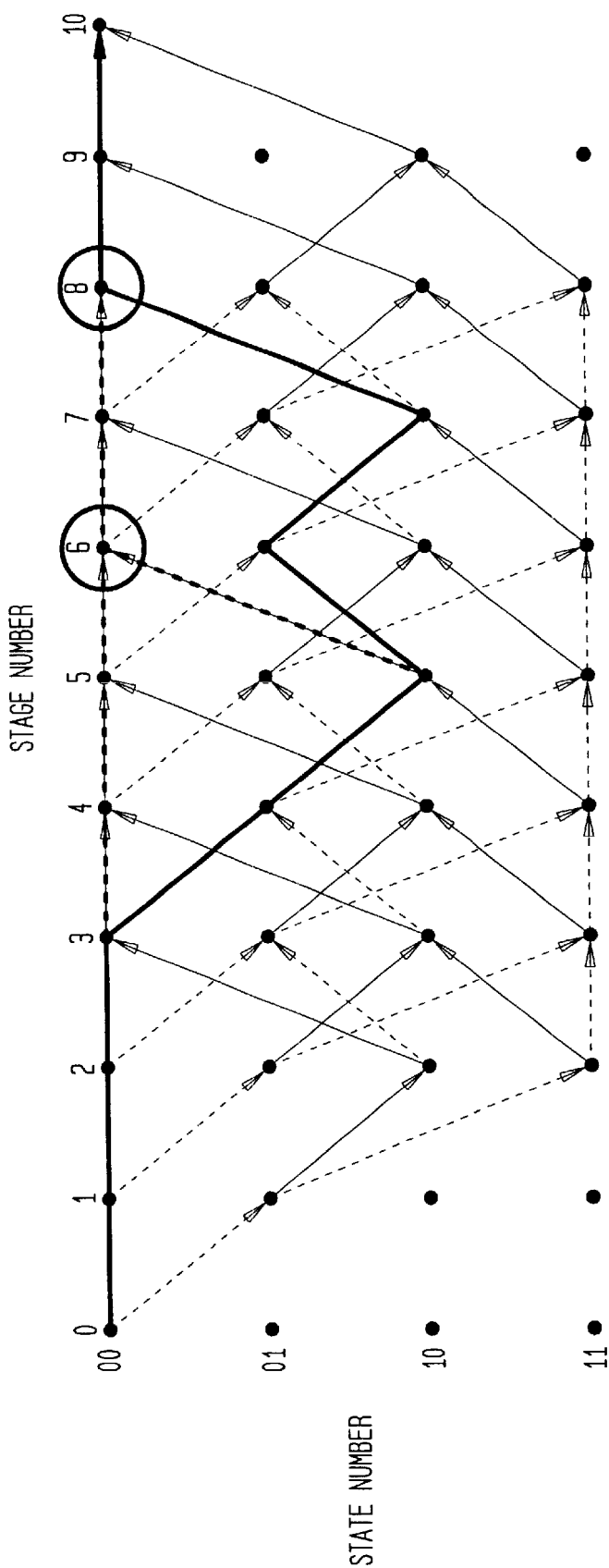
FIG. 15 illustrates the exemplary trellis of FIG. 3 as processed by a list Viterbi algorithm (LVA) where L=3.

An example of a LVA with L=3 is shown in FIG. 15. In this example, the information contained in the list indicates that the second best path (the dark dashed line) deviates from the first best path (the thick black line) at state 00 of stage 8, and that the third best path (the dark dashed-dotted line) deviates from the second best path at state 00 at stage 6. Again, the frame quality metrics are compared to see if an acceptable decoded sequence was found.

Figure 16:
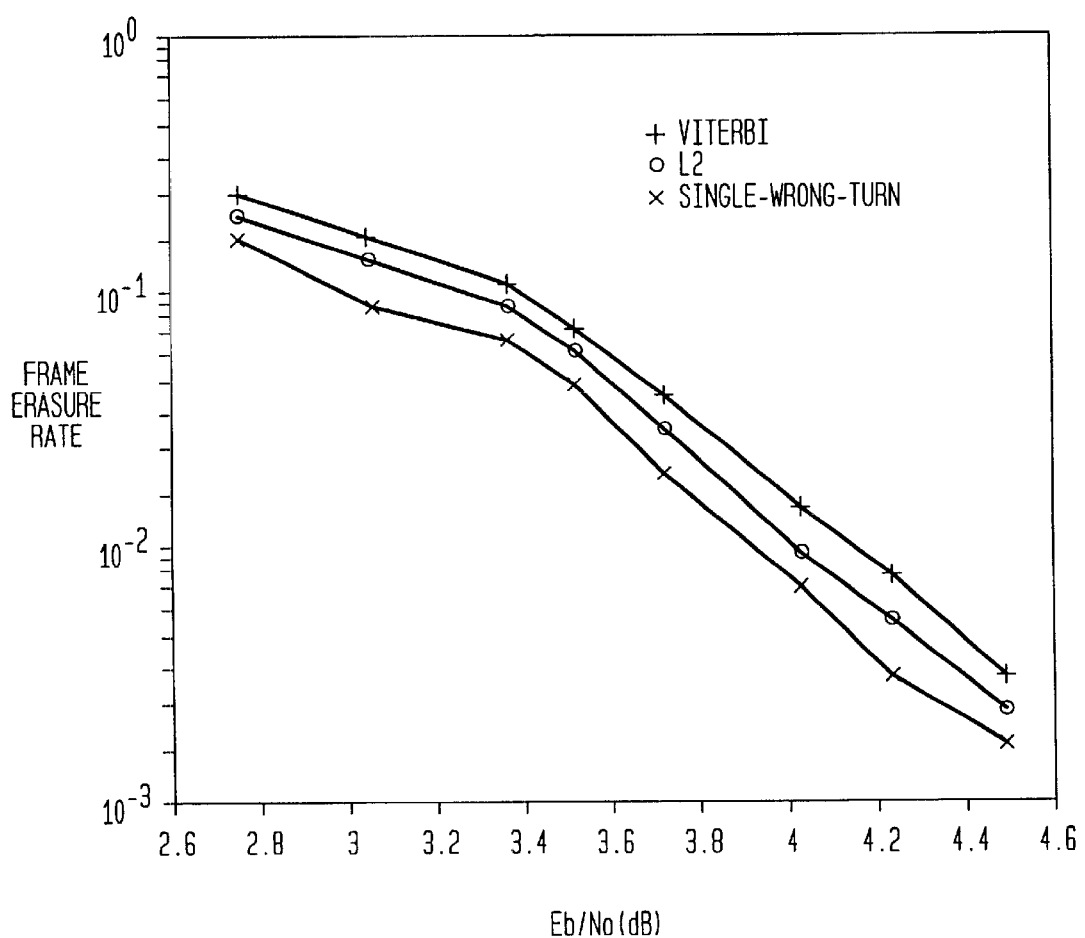
FIG. 16 illustrates comparative results between the conventional Viterbi algorithm, the list Viterbi algorithm, and the recursive (SWT) technique of the present invention.

FIG. 16 illustrates comparative results between the conventional Viterbi algorithm, the list of Viterbi algorithm and the recursive (SWT) technique of the present invention for an RS2 reverse link of an IS-95 system. FIG. 16 assumes k=9, r=½, and 64-ary orthogonal modulation. FIG. 16 clearly illustrates that the recursive or SWT technique of the present invention reduces frame error rate. It is noted that the relative performance gains of the recursive or SWT technique of the present invention over the conventional Viterbi algorithm and the list Viterbi algorithm would be larger for a system with less powerful modulation schemes than the reverse link IS-95 system illustrated in FIG. 16. In particular, the gains for a TDMA system should be on the order of several dB.

As set forth above, the recursive or SWT technique of the present invention may be utilized in any wireless receiver which implements a Viterbi decoder or a suboptimum variant thereof. Such applications include, but are not limited, base station and mobile receivers that service IS-95, GSM, IS-54, or IS-36.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of decoding a received sequence of symbols, comprising:
  decoding the received sequence of symbols to produce a most likely path;
  checking whether a decoded frame produced from the most likely path passes a frame quality metric;
  if the decoded frame produced from the most likely path fails the frame quality metric, recursively tracing back along the most likely path, by deviating from different stages along the most likely path, until a trace back yields a path that produces a decoded frame that passes the frame quality metric; and outputting the decoded frame that passes the frame quality metric.

2. The method of claim 1, wherein the recursive trace back is performed exhaustively for all stages and the decoded frame which is output is the decoded frame with the best frame quality metric.

3. The method of claim 1, wherein the deviation from different stages along the most likely path is a single-wrong-turn deviation.

4. The method of claim 3, wherein the different stages are stages of a trellis.

5. The method of claim 4, wherein the deviation begins from an arbitrary stage in the trellis.

6. The method of claim 5, wherein the deviation begins from the last stage in the trellis.

7. The method of claim 5, wherein the deviation begins from the first stage in the trellis.

8. The method of claim 1, wherein said method does not maintain a list of the L (L>1) best paths.

9. The method of claim 1, wherein the frame quality metric is a cyclic redundancy code.

10. The method of claim 1, wherein said method is performed by a wireless receiver.

11. The method of claim 10, wherein the wireless receiver is one of a base station and a mobile receiver.

12. The method of claim 10, wherein the wireless receiver operates in one of an IS-95, GSM, IS-54, and IS-136 system.

13. An apparatus comprising:
a viterbi decoder for decoding a received sequence of symbols to produce a most likely path and for checking whether a decoded frame produced from the most likely path passes a frame quality metric;
if the decoded frame produced from the most likely path fails the frame quality metric, said viterbi decoder recursively tracing back along the most likely path, by deviating from different stages along the most likely path, until a trace back yields a path that produces a decoded frame that passes the frame quality metric and outputting the decoded frame that passes the frame quality metric.

14. The apparatus of claim 13, wherein said viterbi decoder performs the recursive trace back exhaustively for all stages and the decoded frame which is output is the decoded frame with the best frame quality metric.

15. The apparatus of claim 13, wherein said viterbi decoder deviates from different stages along the most likely path using a single-wrong-turn deviation.

16. The apparatus of claim 15, wherein the different stages are stages of a trellis.

17. The method of claim 16, wherein the deviation begins from an arbitrary stage in the trellis.

18. The apparatus of claim 17, wherein said viterbi decoder begins the deviation from the last stage in the trellis.

19. The apparatus of claim 17, wherein said viterbi decoder begins the deviation from the first stage in the trellis.

20. The apparatus of claim 13, wherein said viterbi decoder does not maintain a list of the L (L>1) best paths.

21. The apparatus of claim 13, wherein the frame quality metric is a cyclic redundancy code.

22. The apparatus of claim 13, wherein said apparatus is part of a wireless receiver.

23. The apparatus of claim 22, wherein the wireless receiver is one of a base station and a mobile receiver.

24. The apparatus of claim 23, wherein the wireless receiver operates in one of an IS-95, GSM, IS-54, and IS-136 system.

* * * * *